United States Patent
Berger et al.

(10) Patent No.: US 11,733,312 B2
(45) Date of Patent: Aug. 22, 2023

(54) IMPEDANCE MEASUREMENT USING A MULTIPLEXER AND ANALOG-TO-DIGITAL CONVERTERS

(71) Applicant: Infineon Technologies AG, Neubiberg (DE)

(72) Inventors: Andreas Berger, Klagenfurt (AT); Stefano Marsili, Faak am See (AT); Francesco Conzatti, Villach (AT)

(73) Assignee: Infineon Technologies AG, Neubiberg (DE)

( * ) Notice: Subject to any disclaimer, the term of this patent is extended or adjusted under 35 U.S.C. 154(b) by 384 days.

(21) Appl. No.: 16/898,188

(22) Filed: Jun. 10, 2020

(65) Prior Publication Data

US 2021/0389378 A1  Dec. 16, 2021

(51) Int. Cl.
 *G01R 31/385* (2019.01)
 *G01R 31/389* (2019.01)
(52) U.S. Cl.
 CPC ......... *G01R 31/389* (2019.01); *G01R 31/385* (2019.01)
(58) Field of Classification Search
 CPC ............... G01R 31/389; G01R 31/385; G01R 31/3835; G01R 35/00; G01R 31/396; G01R 31/54; G01R 31/26; G01R 31/52; H02S 50/00; Y02E 10/50
 USPC ................................................. 324/425–434
 See application file for complete search history.

(56) References Cited

U.S. PATENT DOCUMENTS

| 10,481,214 | B2 | 11/2019 | Marsili et al. |
| 2019/0115762 | A1 | 4/2019 | Marsili et al. |
| 2020/0103466 | A1* | 4/2020 | Büthker ............ G01R 31/3835 |
| 2021/0223324 | A1* | 7/2021 | Kondo ................. H02J 7/0048 |
| 2021/0223327 | A1* | 7/2021 | Berger ................ G01R 31/389 |

OTHER PUBLICATIONS

Texas Instruments, "BQ40Z50-R2 1-Series, 2-Series, 3-Series, and 4-Series Li-Ion Battery Pack Manager," Data Sheet SLUSCS4B, Revised Jan. 2020, retrieved from http://www.ti.com/lit/ds/symlink/bq40z50-r2.pdf?HQS=TI-null-null-mousermode-df-pf-null-wwe&DCM=yes&ref_url=https%3A%2F%2Fwww.mouser.com%2F&distId=26, 52 pp.

* cited by examiner

*Primary Examiner* — Lee E Rodak
*Assistant Examiner* — Trung Q Nguyen
(74) *Attorney, Agent, or Firm* — Shumaker & Sieffert, P.A.

(57) ABSTRACT

In some examples, a device can be used for measuring the impedance of a first battery cell. The device includes a first analog-to-digital converter (ADC) and a second ADC. The device also includes a multiplexer configured to connect the first ADC to the first battery cell in a first instance and to connect the second ADC to a current sensor in the first instance. The current sensor is configured to sense current through the first battery cell. The multiplexer is also configured to connect the first ADC to the current sensor in a second instance and to connect the second ADC to the first battery cell in the second instance or in a third instance.

13 Claims, 10 Drawing Sheets

IMPEDANCE MEASUREMENT USING A MULTIPLEXER AND ANALOG-TO-DIGITAL CONVERTERS

TECHNICAL FIELD

This disclosure relates to measuring an impedance of a battery.

BACKGROUND

In battery management applications, the complex alternating-current (AC) impedance information can be used for estimating several internal parameters of a battery cell such as the internal cell temperature, state of health, and state of charge. To measure the AC impedance of a whole battery pack, the impedance of every single battery cell has to be monitored. Thus, to monitor the impedance of every cell, N integrated circuits (ICs) are mounted on the N in-series connected battery cells. In an electric vehicle, the number N is in the range of 100. From the system point of view, such an approach is costly due to the high number of required ICs.

SUMMARY

This disclosure describes techniques for measuring the impedance of a first battery cell using at least two analog-to-digital converters (ADCs), a multiplexer, and a current sensor that can sense the current flowing through the first battery cell. The multiplexer may be configured to connect, in a first instance, a first ADC to the first battery cell and connect, in the first instance, a second ADC to the current sensor. The multiplexer may be configured to also connect the first ADC to the current sensor in a second instance. The multiplexer may be further configured to connect the second ADC to the first battery cell in the second instance or in a third instance.

In some examples, a device can be used for measuring the impedance of a first battery cell. The device includes a first ADC and a second ADC. The device also includes a multiplexer configured to connect the first ADC to the first battery cell in a first instance and to connect the second ADC to a current sensor in the first instance. The current sensor is configured to sense current through the first battery cell. The multiplexer is also configured to connect the first ADC to the current sensor in a second instance and to connect the second ADC to the first battery cell in the second instance or in a third instance.

In some examples, a method includes connecting, by a multiplexer in a first instance, a first ADC of at least two ADCs to a first battery cell. The method also includes connecting, by the multiplexer in the first instance, a second ADC of the at least two ADCs to a current sensor, wherein the current sensor is configured to sense current through the first battery cell. The method further includes connecting, by the multiplexer in a second instance, the first ADC to the current sensor. The method includes connecting, by the multiplexer in the second instance or in a third instance, the second ADC to the first battery cell.

In some examples, a system includes a first battery cell, a current sensor configured to sense the current through the first battery cell, and at least two ADCs including a first ADC and a second ADC. The system also includes a multiplexer configured to connect the first ADC to the first battery cell in a first instance and to connect the second ADC to the current sensor in the first instance. The multiplexer is also configured to connect the first ADC to the current sensor in a second instance and to connect the second ADC to the first battery cell in the second instance or in a third instance.

The details of one or more examples are set forth in the accompanying drawings and the description below. Other features, objects, and advantages will be apparent from the description and drawings, and from the claims.

DETAILED DESCRIPTION

This disclosure describes devices, methods, and techniques for measuring the alternating current (AC) impedance of multiple, stacked battery cells using a single integrated circuit (IC). The terminals of each battery cell may be multiplexed to more than one analog-to-digital converter (ADC), so that each ADC can measure the voltage across the battery cell. By multiplexing more than one ADC to a battery cell, a device can compensate for the measurement error in multi-cell impedance ICs arising from the ADCs mismatches (e.g., gain and phase mismatch among the ADCs).

Figure 1:
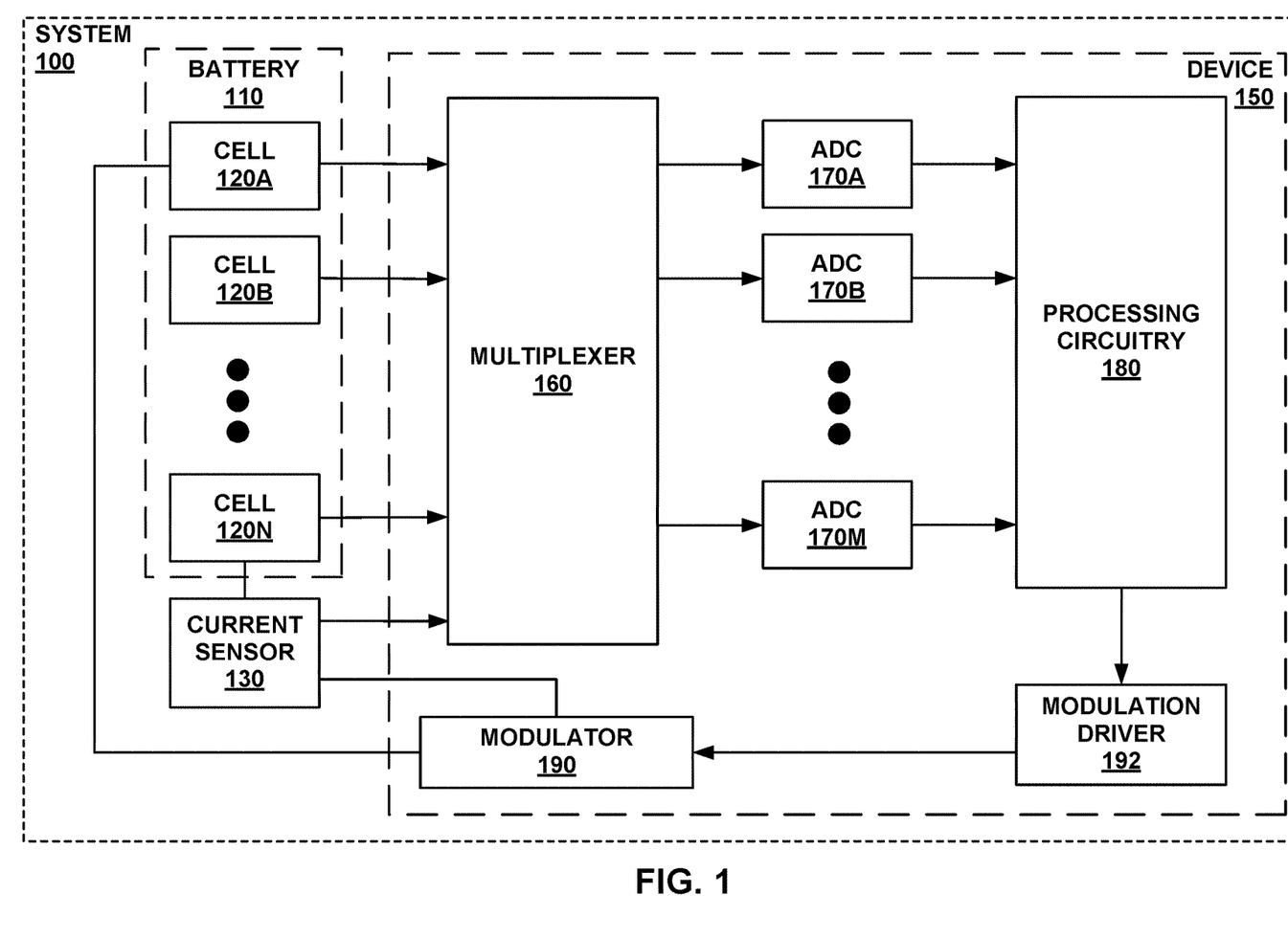
FIG. 1 is a conceptual block diagram of a system including a battery, a multiplexer, and at least two analog-to-digital converters (ADCs), in accordance with the techniques of this disclosure.

FIG. 1 is a conceptual block diagram of a system 100 including a battery 110, a multiplexer 160, and at least two ADCs 170A-170M, in accordance with the techniques of this disclosure. In the example shown in FIG. 1, system 100 includes battery 110, current sensor 130, and device 150. Battery 110 includes cells 120A-120N, where N is an integer. Device 150 includes multiplexer 160, ADCs 170A-170M, processing circuitry 180, and optional modulator 190 and modulation driver 192, where M is an integer that may be equal to or different from N.

Device 150 may include a single semiconductor substrate, where multiplexer 160, ADCs 170A-170M, processing circuitry 180, optional modulator 190, and optional modulation driver 192 are integrated into the single semiconductor substrate. Alternatively, device 150 may include more than one semiconductor substrate for the multiplexer 160, ADCs 170A-170M, processing circuitry 180, optional modulator 190, and optional modulation driver 192.

Battery 110 may comprise lithium-ion cells, lithium iron phosphate cells, lithium sulfur cells, sodium-ion cells, nickel-cadmium cells, nickel-metal cells, and/or any other type of cells. In some examples, cells 120A-120N may be arranged in series and/or parallel. Cells 120A-120N may be configured to generate a battery voltage that results in a current flowing through current sensor 130 and/or modulator 190.

Current sensor 130 may be configured to sense the excitation current flowing through cells 120A-120N. For example, current sensor 130 can be connected in series with cells 120A-120N and modulator 190. Current sensor 130 may include a shunt resistor, a magnetoresistive element, a current mirror, an ammeter, and/or any other current sensing component. Current sensor 130 may partially or fully internal and/or partially or fully external to device 150. Device 150 may include input/output nodes for connecting an external current sensing element. For example, current sensor 130 may include an external resistance with an optional internal resistance.

In order to determine the state of health of each of cells 120A-120N, device 150 may be configured to determine the impedance of each of cells 120A-120N. However, the achievable measurement accuracy may depend on the matching among all of ADCs 170A-170M. Matching can be addressed by layout/floor planning, but an increased number of ADCs may limit the usefulness of layout/floor planning. For example, the arrays of ADCs 170A and 170B may be inter-digitated so that each of ADCs 170A and 170B has the same chip neighborhood. Each of ADCs 170A and 170B can be made with the same macro so that each of ADCs 170A and 170B use the same subcircuit layout. To better match ADCs 170A and 170B, each ADC may have the same length of route line. In addition, larger-sized ADC may be more easily matched than minimum-sized ADCs.

In accordance with the techniques of this disclosure, multiplexer 160 may be configured to connect ADC 170A to cell 120A in a first instance while connecting ADC 170B to current sensor 130. In a second instance, multiplexer 160 may be configured to connect ADC 170A to current sensor 130. In the second instance or a third instance, multiplexer 160 may be configured to connect ADC 170B to cell 120A. Using these multiplexing techniques, device 150 may be able to compensate for the measurement error arising from mismatch among ADCs 170A-170M (e.g., gain and phase mismatch). In addition, processing circuitry 180 may be configured to implement a digital post-processing algorithm to compensate for the measurement error arising from ADC mismatch. The connections between the ADCs and the cells should be kept as short as possible to reduce any measurement errors.

In some examples, multiplexer 160 may be configured to connect one or more of cells 120A-120N and current sensor 130 to two or more of ADCs 170A-170M in a round-robin sequence, scheme, or protocol. Device 150 may be configured to use X number of ADCs 170A-170M to test X number of cells 120A-120N, where X is an integer. Additionally or alternatively, device 150 may be configured to use X+1 number of ADCs 170A-170M to test X number of cells 120A-120N, where X is an integer.

ADCs 170A-170M may include sigma-delta ADCs, successive approximation ADCs, flash ADCs, half-flash ADCs, pipelined ADCs, and/or any other type of ADCs. The bandwidth and signal-to-noise ratio of ADCs 170A-170M may be important parameters.

While multiplexer 160 has connected a battery cell to one of ADCs 170A-170M or current sensor 130, the ADC may be configured to convert the voltage or current across the ADC or sensor to a digital number. Multiplexer 160 may be configured to connect the ADC to the cell or sensor for a sufficient period of time to allow the ADC to convert the analog voltage or current to the digital number. Multiplexer 160 may be configured to consecutively and/or successively connect ADCs to 170A-170M to cells 120A-120N and current sensor 130 to minimize the time between measurements to reduce the amount of time-based drift experienced by the measured parameters.

Device 150 may include fewer ADCs, as compared to a device that has a dedicated ADC for each cell. For example, another device may include N battery cells and N+1 ADCs, where each ADC is dedicated to a battery cell and one ADC is dedicated to the current sensor. The other device may have a separate circuit for measuring the voltage across each cell. Each ADC may take up a substantial amount of chip space. In contrast, device 150 may include a set of X ADCs (e.g., three or four ADCs) that can be used to connect to a set of ten or fifteen cells in subsets of X or X−1 ADCs at a time. Thus, by using fewer ADCs than other devices for measuring the impedance of a battery, device 150 may have reduced overall system costs and/or smaller chip size.

Processing circuitry 180 may include any suitable arrangement of hardware, software, firmware, or any combination thereof, to perform the techniques attributed to processing circuitry 180 herein. Examples of processing circuitry 180 include any one or more microprocessors, digital signal processors (DSPs), application specific integrated circuits (ASICs), field programmable gate arrays (FPGAs), or any other equivalent integrated or discrete logic circuitry, as well as any combinations of such components. When processing circuitry 180 includes software or firmware, processing circuitry 180 further includes any hardware for storing and executing the software or firmware, such as one or more processors or processing units. In examples in which device 150 is mounted on a vehicle, processing circuitry 180 may be implemented by a headlight controller.

In general, a processing unit may include one or more microprocessors, DSPs, ASICs, FPGAs, or any other equivalent integrated or discrete logic circuitry, as well as any combinations of such components. Although not shown in FIG. 1, processing circuitry 180 may include a memory configured to store data. The memory may include any volatile or non-volatile media, such as a random access memory (RAM), read only memory (ROM), non-volatile RAM (NVRAM), electrically erasable programmable ROM (EEPROM), flash memory, and the like. In some examples, the memory may be external to processing circuitry 180 (e.g., may be external to a package in which processing circuitry 180 is housed).

Modulator 190 comprises an optional component of device 150 that may include a transistor for modulating the current flowing through cells 120A-120N and current sensor 130. Modulator 190 may be configured to connect across cells 120A-120N to cause a modulated current (e.g., an excitation current) to flow through at least one of cells 120A-120N. Although modulators are represented in other figures (e.g., FIGS. 4-8) as current sources, the modulator may only permit or impede current, where the current is actually is driven by battery 110.

Processing circuitry 180 may be configured to control modulator driver 192 to generate a drive signal at a drive signal frequency for driving modulator 190. Modulator 190 may be configured to drive or modulate a current into cells 120A-120N by driving only a positive current that charges the battery, only a negative current that discharges the battery, or alternatingly a positive current and a negative current. Processing circuitry 180 may be configured to control modulator driver 192 to turn on and off modulator 190 at the frequency of the AC current at which the cell voltages are to be measured.

Modulator 190 may be part of device 150 or may be a separate component outside of device 150. In some examples, modulator driver 192 may be part of device 150, while modulator 190 may be off-chip. In other examples, both of modulator 190 and modulator driver 192 may be on-chip or off-chip.

Processing circuitry 180 may be configured to control modulator driver 192 to cause a direct current or an alternating current to flow through modulator 190, cells 120A-120N, and current sensor 130. The current flowing through modulator 190, cells 120A-120N, and current sensor 130 may be driven by the battery voltage generated by cells 120A-120N through a current path of modulator 190 and back through cells 120A-120N. An alternating current is a current that includes an AC component and that may also include a DC offset. In some examples, the AC component includes a sinusoidal waveform, a rectangular waveform, a triangular waveform, and/or a sine square waveform.

In some examples, battery 110 may include tens or hundreds of cells. In some examples, device 150 may include a first set of three or four ADCs for connecting to a first set of three cells of battery 110 and a second set of three or four ADCs for connecting to a second set of three cells of battery 110. In other words, each set of cells may have a dedicated set of ADCs. Thus, device 150 may include N or more ADCs, where N is the number of cells in battery 110. In some examples, the ADCs may be distributed across multiple devices.

Additionally or alternatively, device 150 may include one set of ADCs (e.g., four ADCs) that are configured to connect to all of the cells in battery 110. Device 150 may include a switching network configured to connect the set of ADCs to the first set of cells then to the second set of cells, and so on. The switching network may be configured to slide the set of ADCs along the cells of battery 110.

As yet another example, device 150 may include more than one set of ADCs, where each set of ADCs is configured to connect to multiple sets of cells. For example, a first set of three ADCs may be configured to connect to several sets of ADCs, where each set of ADCs includes two or three ADCs. A second set of three ADCs may be configured to connect to a several additional sets of ADCs, where each set of ADCs includes two or three ADCs. Thus, a battery with one hundred cells may include fifteen or twenty ADCs divided into sets (e.g., three or five sets), where each of the sets of ADCs is configured to connect to ten or twenty cells by connecting to sets of two or three cells at a time.

Figure 2:
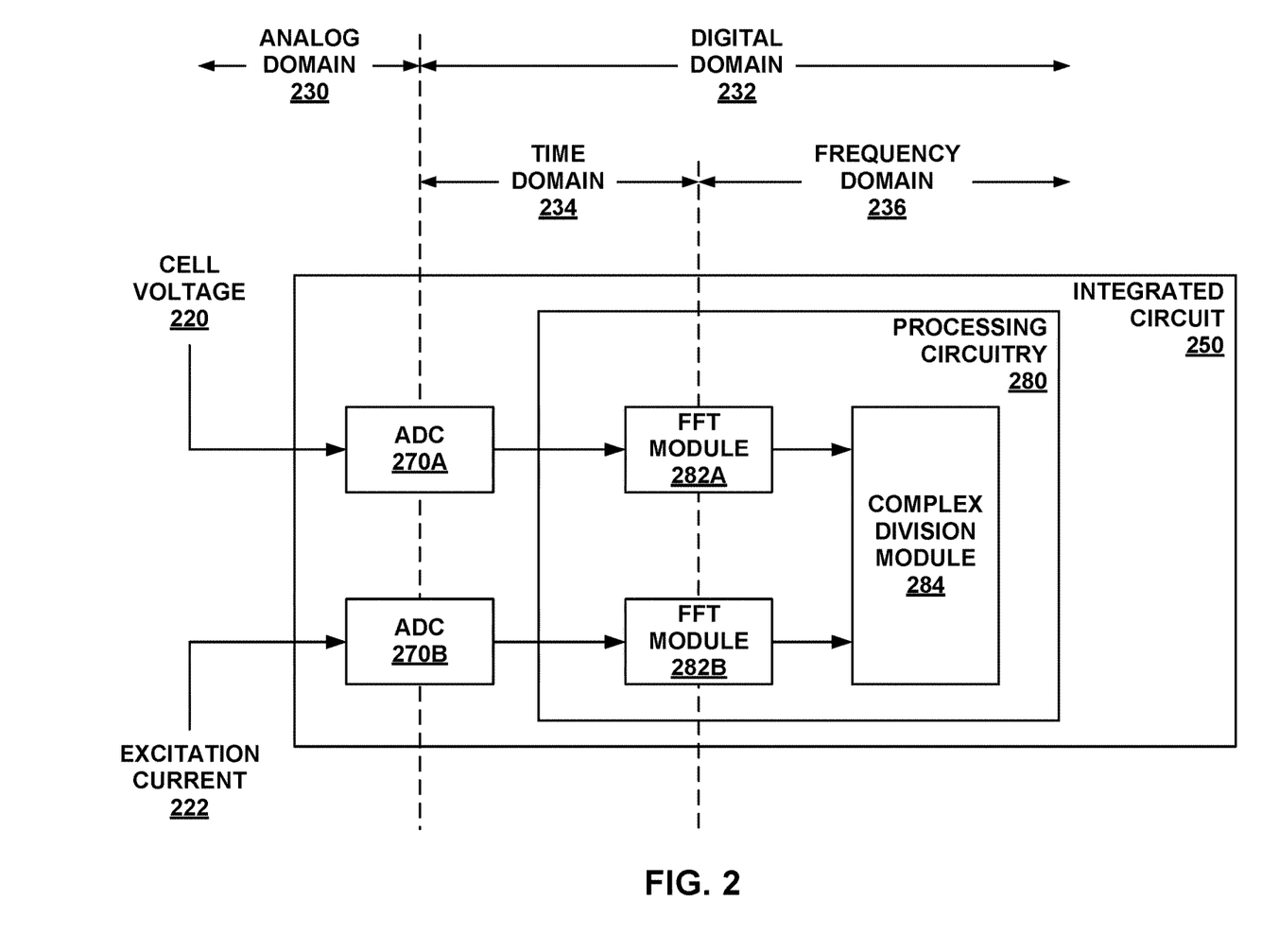
FIG. 2 is a conceptual block diagram of an integrated circuit configured to apply a Fast Fourier Transform to the output of two ADCs, in accordance with the techniques of this disclosure.

FIG. 2 is a conceptual block diagram of an IC 250 configured to apply a Fast Fourier Transform to the output of two ADCs 270A and 270B, in accordance with the techniques of this disclosure. In the example shown in FIG. 2, IC 250 includes ADCs 270A and 270B and processing circuitry 280.

ADC 270A may be configured to receive an indication of cell voltage 220, and ADC 270B is configured to receive an indication of excitation current 222. Cell voltage 220 and excitation current 222 exist in analog domain 230. In some examples, ADC 270A receives the indication of cell voltage 220 via a sense resistor connected across the differential inputs of ADC 270A. ADC 270B may receive the indication of excitation current 222 via a current sensing element, where excitation current 222 flows through one or more battery cells. The indication of excitation current 222 may be a voltage value across a sense resistance and/or a signal outputted by a current sensor.

ADCs 270A and 270B can convert the analog values 220 and 222 in analog domain 230 to digital numbers in digital domain 232 and time domain 234. ADC 270A may introduce a gain $g_v$ to the digital output of ADC 270A, and ADC 270B may introduce a gain $g_i$ to the digital output of ADC 270B.

In the example of FIG. 2, processing circuitry 280 includes Fast Fourier Transform (FFT) modules 282A and 282B and complex division module 284. FFT modules 282A and 282B may include front-end filtering, such as low-pass filters to remove high-frequency noise. Processing circuitry 280 may be configured to apply the FFTs to produce outputs in frequency domain 236. the outputs of FFT modules 282A and 282B may include Fourier representations with the voltage gain Gv and the current gain Gi, respectively. It may be desirable to have a ratio of one between the voltage gain Gv and the current gain Gi.

The extra gain coming from the filter and FFT modules 282A and 282B may be added purely in digital domain 232. Thus, the added gain may be controllable by processing circuitry 280. For example, processing circuitry 280 may be configured to determine whether there is a mismatch between the voltage gain and the current gain. In response to determining that there is a mismatch, processing circuitry 280 may be configured to zero out the gains.

Processing circuitry 280 may be configured to divide the voltage output of FFT module 282A by the current output of FFT module 282B in complex division module 284. By complex dividing the outputs of FFT modules 282A and 282B, processing circuitry 280 can determine an estimate of the impedance of a battery cell. Processing circuitry 280 may be configured to output the estimated impedance to a device outside of IC 250. An example output of complex division module 284 is shown below in Equation (1).

$$Z = \frac{V_{mag}}{I_{mag}} \frac{G_v}{G_i R_s} e^{j(\varphi_v - \varphi_i + \Delta_v - \Delta_i)} \tag{1}$$

Figure 3:
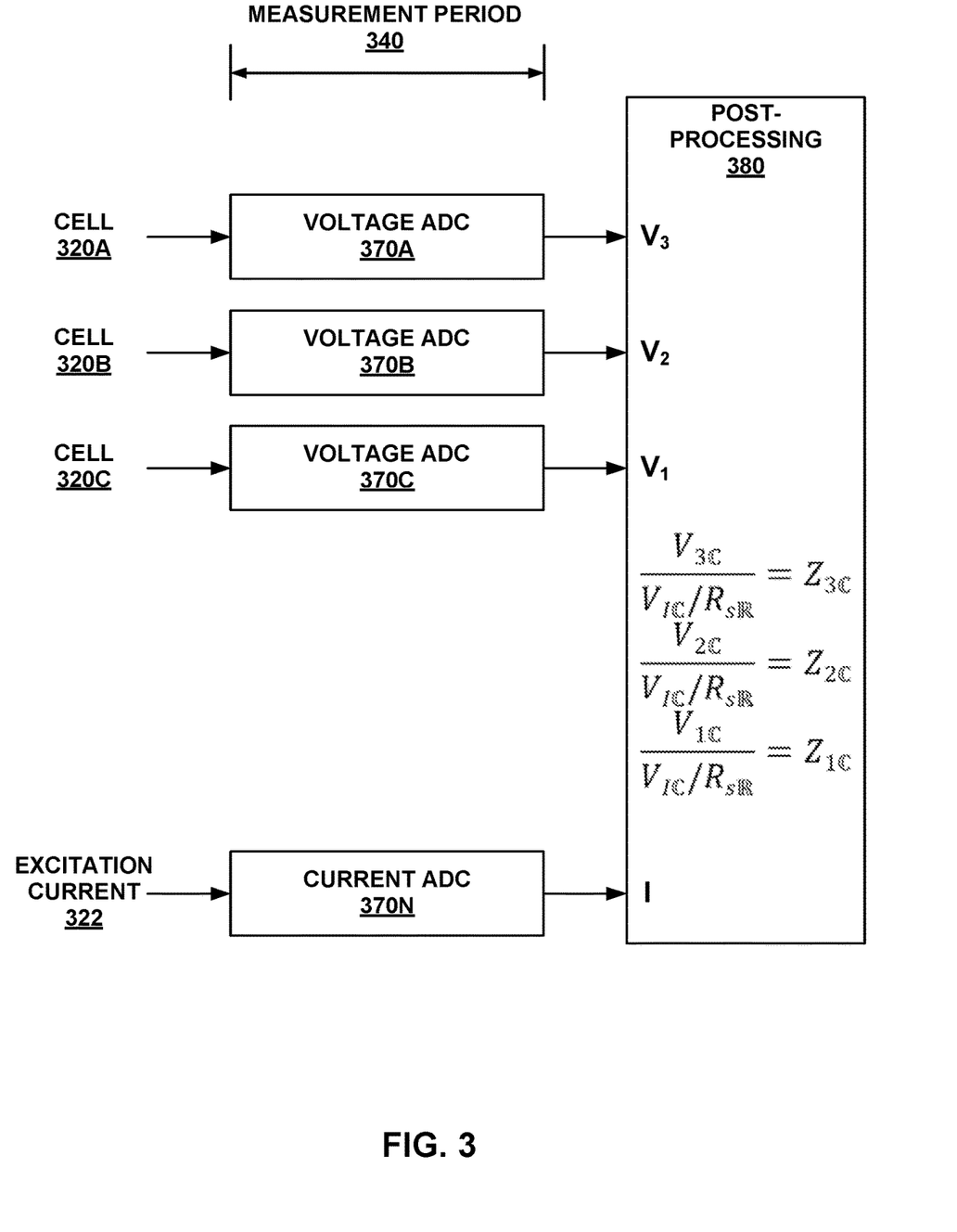
FIG. 3 is a conceptual block diagram depicting the measurement period for four ADCs, in accordance with the techniques of this disclosure.

FIG. 3 is a conceptual block diagram depicting the measurement period 340 for four ADCs 370A-370C and 370N, in accordance with the techniques of this disclosure. As shown in FIG. 3, all three cells 320A-320C can be excited and measured in one measurement period 340. The resulting individual impedance values of cells 320A-320C can be calculated by post-processing 380 using Equation (2), where $V_{IC}$ represents the current-to-voltage converted equivalent complex common measurement current for all cells, $R_{sR}$ is the actual resistance value of the sense resistor, and the index x indicates the number of the battery cell for which the impedance is calculated.

$$Z_{xC} = \frac{V_{xC}}{V_{IC}/R_{sR}} \tag{2}$$

When converting the signals to the digital domain, each of ADCs 370A-370C and 370N adds a gain and phase error to the converted value. For the accuracy of the impedance measurement, the gain and phase mismatch between the current ADC 370N and each of the voltage ADCs 370A-370C should be as small as possible such that the ratio is approximately equal to one and the result of the impedance calculation is not affected.

In contrast, a single-cell system having two ADCs may use layout and floor-planning techniques to minimize the gain and phase mismatch between those two ADCs. Additionally, a system chopping approach can be used to switch the input of the two ADCs, which can be used in a test mode in the single-cell system. For a larger number of ADCs, however, impedance IC floor-planning and layout techniques may not be feasible any more to achieve sufficient matching.

Each of ADCs 370A-370C and 370N may be driven by an input buffer, which also contributes to the gain and phase mismatch. Although not shown in FIG. 3, a switching element may be present at the input of each signal path (e.g., at the input of each of ADCs 370A-370C and 370N). Additional example details of gain and phase mismatch for ADCs and the measurement of battery impedance are described in commonly assigned U.S. Pat. No. 10,481,214, entitled "Battery Temperature Detection," issued on Nov. 19, 2019, and commonly assigned U.S. Patent Application Publication Number 2019/0115762, entitled "Battery Impedance Detection," filed on Oct. 12, 2017, the entire contents of which are incorporated herein by reference.

Figure 4:
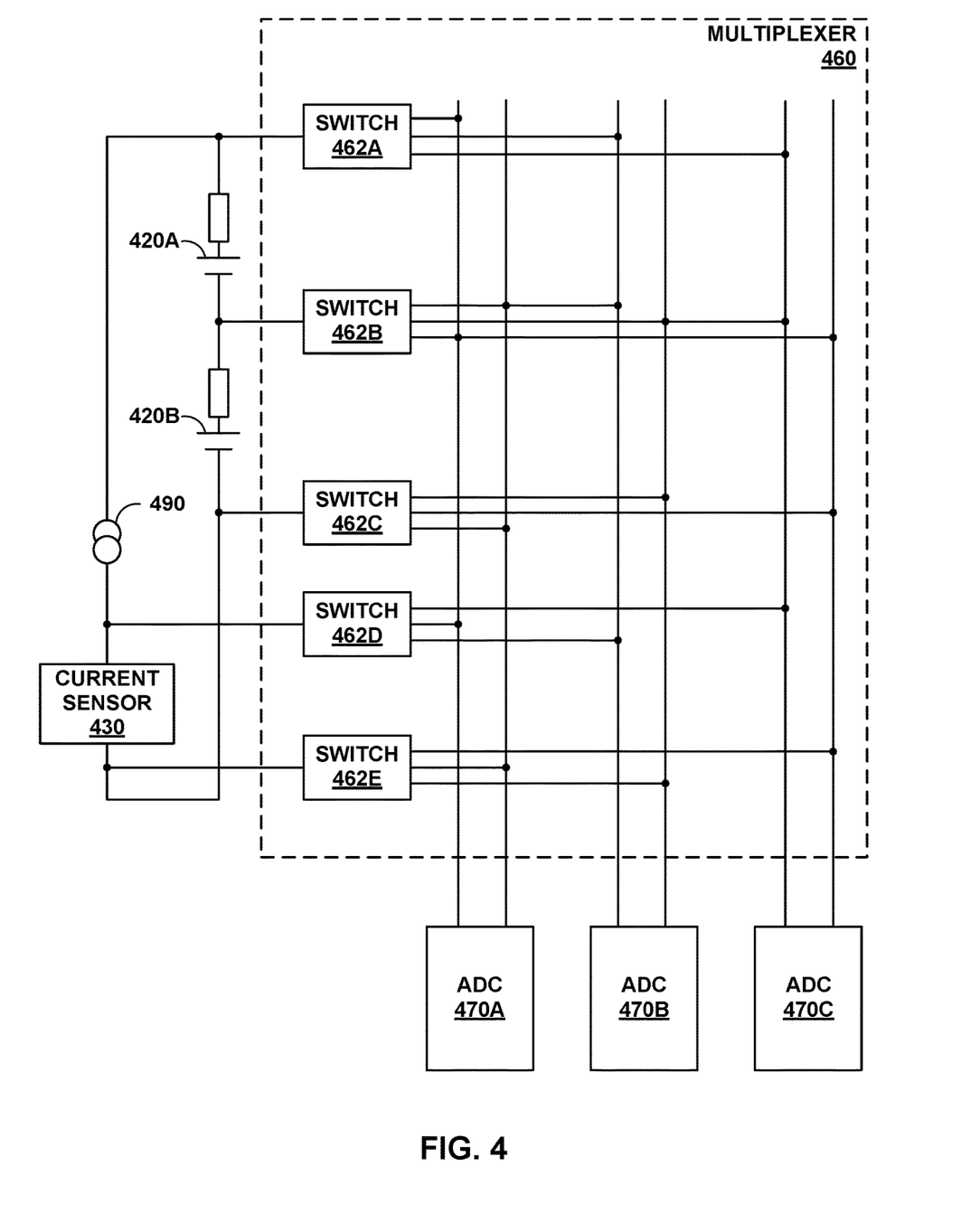
FIGS. 4-8 are conceptual block diagrams of multiplexers configured to connect ADCs to battery cells, in accordance with the techniques of this disclosure.

FIGS. 4-8 are conceptual block diagrams of multiplexers 460, 560, 660, 760, and 860 configured to connect ADCs 470A-470C, 570A-570C, 670A-670C, 770A-770C, and 870A-870P to battery cells, in accordance with the techniques of this disclosure. In the examples shown in FIGS. 4-7, the batteries include two cells connected in series. However, a battery may include more than two cells, and the cells may be connected in parallel and/or series. Each cell may include a voltage source, a resistance, and/or a capacitance. For example, cells 420A and 420B are depicted in FIG. 4 as including a resistance and a voltage source, but cells 420A and 420B may also include capacitance and/or inductance.

Modulator 490 may include as one or more transistors. The modulator may be operated to allow an AC and/or DC current to flow through cells 420A and 420B, current sensor 430, and modulator 490. The current may be driven by the voltage produced by cells 420A and 420B.

Figure 5:
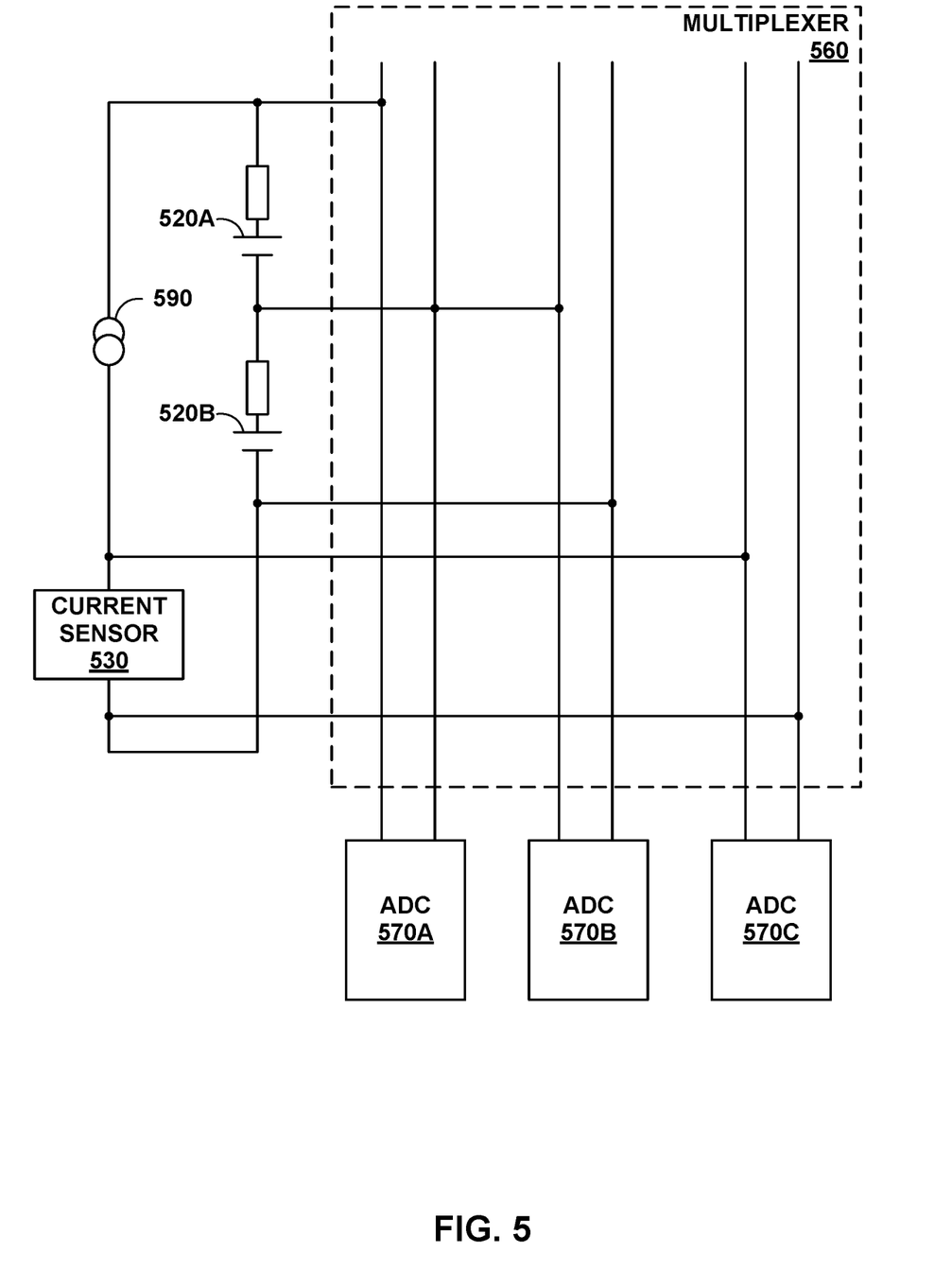
Figure 6:
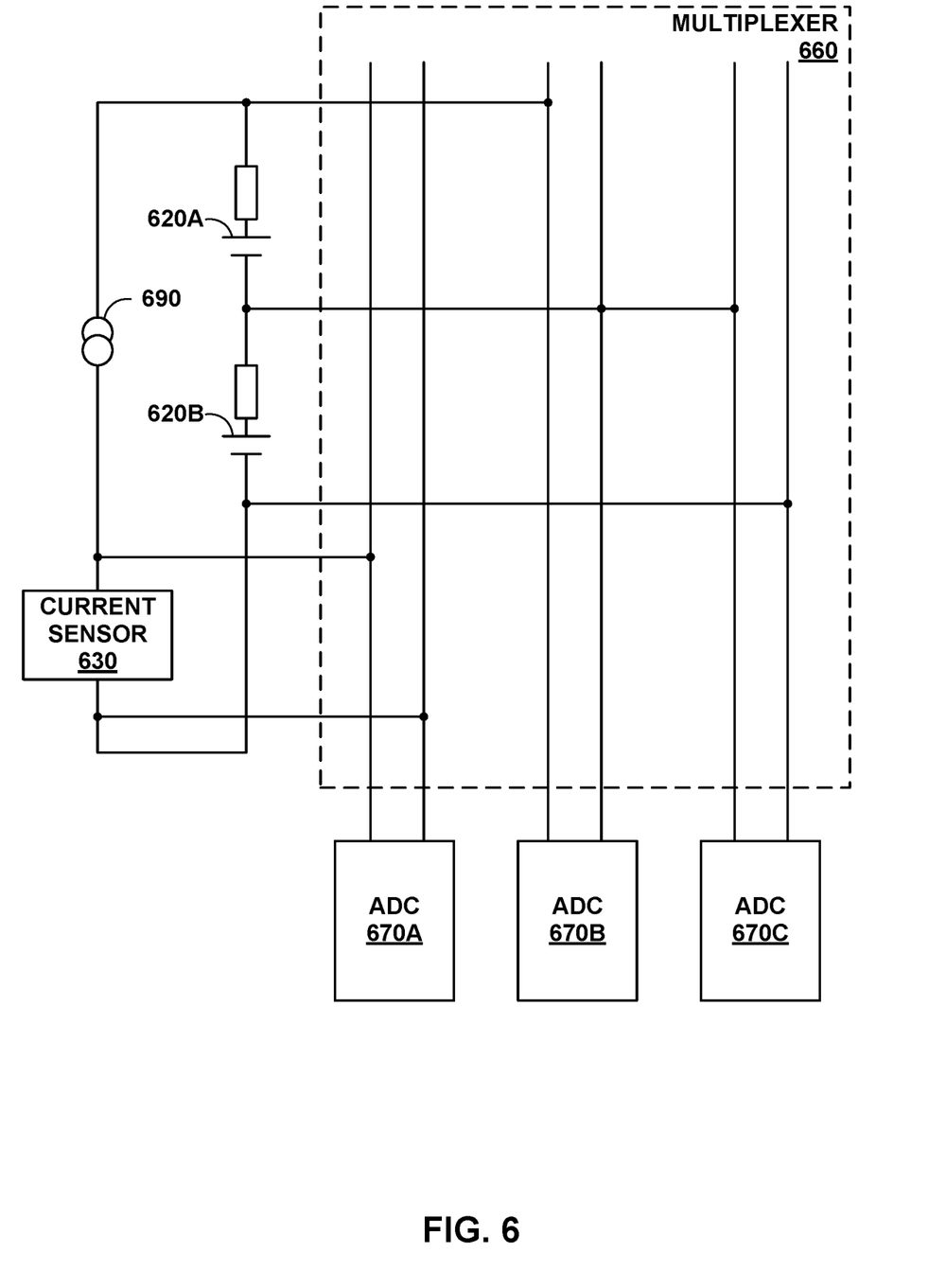
Figure 7:
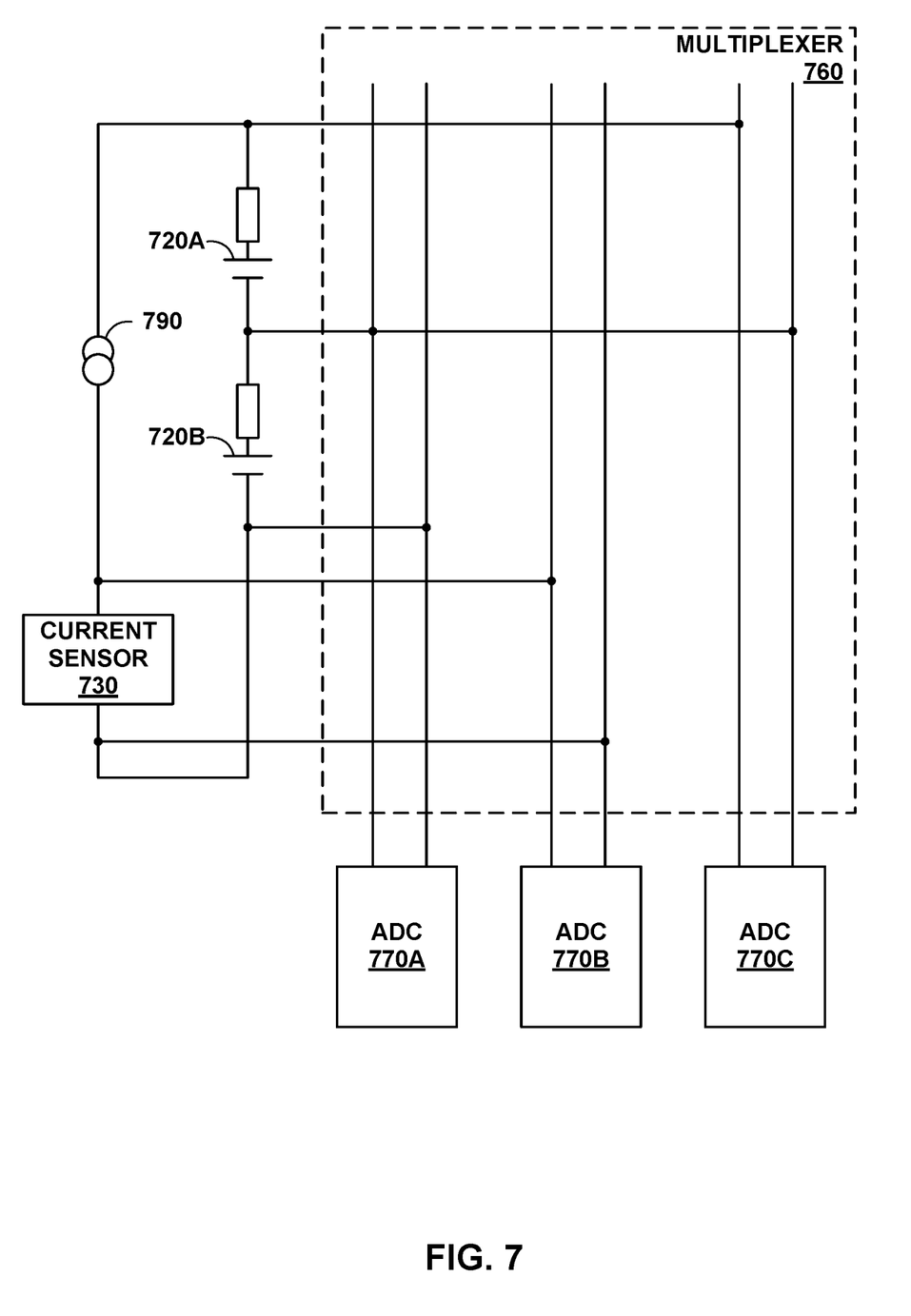

The mismatch between different ADCs 470A-470C, and thus the error of the impedance measurement, can be compensated by using a special measurement sequence, as shown in FIGS. 5-7. Processing circuitry may be configured to control the measurement sequence and implement a digital post processing algorithm.

Multiplexer 460 may include a high-voltage multiplexer configured to switch between ADCs 470A-470C. In some examples, each of cells 420A and 420B may product three or five volts, so tens or hundreds of cells in series may produce a high voltage. An example measurement sequence is presented below in Table I. In practice, ADCs 470A-470C are sequentially switched in a round-robin fashion in order to measure the three different quantities (two voltages and one current). In the round-robin sequence presented in Table I, each of ADCs 470A-470C converts each electrical quantity once.

TABLE I

Measurement sequence

| | First instance | Second instance | Third instance |
|---|---|---|---|
| ADC 470A | Cell 420A | Current sensor 430 | Cell 420B |
| ADC 470B | Cell 420B | Cell 420A | Current sensor 430 |
| ADC 470C | Current sensor 430 | Cell 420B | Cell 420A |

In a first instance, switches 462A and 462B connect the terminals of cell 420A to ADC 470A, switches 462B and 462C connect the terminals of cell 420B to ADC 470B, and switches 462D and 462E connect the terminals of current sensor 430 to ADC 470C. In the second instance, switches 462A and 462B connect the terminals of cell 420A to ADC 470B, switches 462B and 462C connect the terminals of cell 420B to ADC 470C, and switches 462D and 462E connect the terminals of current sensor 430 to ADC 470A. In the third instance, switches 462A and 462B connect the terminals of cell 420A to ADC 470C, switches 462B and 462C connect the terminals of cell 420B to ADC 470A, and switches 462D and 462E connect the terminals of current sensor 430 to ADC 470B.

FIG. 5 depicts a first instance in which multiplexer 560 connects the terminals of cell 520A to the differential terminals of ADC 570A. In the first instance shown in FIG. 5, multiplexer 560 connects the terminals of cell 520B to the differential terminals of ADC 570B. In the first instance shown in FIG. 5, multiplexer 560 connects the terminals of current sensor 530 to the differential terminals of ADC 570C. Processing circuitry may be configured to determine a first set of preliminary impedances of cells 520A and 520B, which are represented by $Z_{1,T}$ and $Z_{1,B}$, respectively, in Equations (3a)-(3e).

$$V_X = V_T(1 + \delta_1)e^{j\varphi_T}e^{j\beta_1} \quad (3a)$$

$$V_Y = V_B(1 + \delta_2)e^{j\varphi_B}e^{j\beta_2} \quad (3b)$$

$$I = I_0 e^{j\alpha} \quad (3c)$$

$$Z_{1,T} = \frac{V_X}{I} = \frac{V_T(1 + \delta_1)}{I_0}e^{j(\varphi_T+\beta_1-\alpha)} \quad (3d)$$

$$Z_{1,B} = \frac{V_Y}{I} = \frac{V_B(1 + \delta_2)}{I_0}e^{j(\varphi_B+\beta_2-\alpha)} \quad (3e)$$

FIG. 6 depicts a first instance in which multiplexer 660 connects the terminals of cell 620A to the differential terminals of ADC 670B. In the first instance shown in FIG. 6, multiplexer 660 connects the terminals of cell 620B to the differential terminals of ADC 670C. In the first instance shown in FIG. 6, multiplexer 660 connects the terminals of current sensor 630 to the differential terminals of ADC 670A. Processing circuitry may be configured to determine a second set of preliminary impedances of cells 620A and 620B, which are represented by $Z_{2,T}$ and $Z_{2,B}$, respectively, in Equations (4a)-(4e).

$$I = I_0(1 + \delta_1)e^{j\alpha}e^{j\beta_1} \quad (4a)$$

$$V_X = V_T(1 + \delta_2)e^{j\varphi_T}e^{j\beta_2} \quad (4b)$$

$$V_Y = V_B e^{j\varphi_B} \quad (4c)$$

$$Z_{2,T} = \frac{V_X}{I} = \frac{V_T(1 + \delta_2)}{I_0(1 + \delta_1)}e^{j(\varphi_T+\beta_2-\beta_1-\alpha)} \quad (4d)$$

$$Z_{2,B} = \frac{V_Y}{I} = \frac{V_B}{I_0(1 + \delta_1)}e^{j(\varphi_B-\beta_1-\alpha)} \quad (4e)$$

FIG. 7 depicts a first instance in which multiplexer 760 connects the terminals of cell 720A to the differential terminals of ADC 770C. In the first instance shown in FIG. 7, multiplexer 760 connects the terminals of cell 720B to the differential terminals of ADC 770A. In the first instance shown in FIG. 7, multiplexer 760 connects the terminals of current sensor 730 to the differential terminals of ADC 770B. Processing circuitry may be configured to determine a second set of preliminary impedances of cells 720A and 720B, which are represented by $Z_{3,T}$ and $Z_{3,B}$, respectively, in Equations (5a)-(5e).

$$V_Y = V_B(1+\delta_1)e^{j\varphi_B}e^{j\beta_1} \quad (5a)$$

$$I = I_0(1+\delta_2)e^{j\alpha}e^{j\beta_2} \quad (5b)$$

$$V_X = V_T e^{j\varphi_T} \quad (5c)$$

$$Z_{3,T} = \frac{V_X}{I} = \frac{V_T}{I_0(1+\delta_2)}e^{j(\varphi_T - \beta_2 - \alpha)} \quad (5d)$$

$$Z_{3,B} = \frac{V_Y}{I} = \frac{V_B(1+\delta_1)}{I_0(1+\delta_2)}e^{j(\varphi_B + \beta_1 - \beta_2 - \alpha)} \quad (5e)$$

The processing circuitry can determine the corrected or composite impedances of each cell based on the preliminary impedances according to Equations (6a) and (6b). Less-resource demanding approximations are obtained using Equations (7a) and (7b), which can be used for on-chip implementation. Equations (7a) and (7b) use second-order mismatch terms, which are one order of magnitude lower than the first-order mismatch terms.

$$Z_{T,avg} = \sqrt[3]{Z_{1,T}Z_{2,T}Z_{3,T}} = \sqrt[3]{\frac{V_T^3}{I_0^3}e^{j(3\varphi_T - 3\alpha)}} \quad (6a)$$

$$Z_{B,avg} = \sqrt[3]{Z_{1,B}Z_{2,B}Z_{3,B}} = \sqrt[3]{\frac{V_B^3}{I_0^3}e^{j(3\varphi_B - 3\alpha)}} \quad (6b)$$

$$Z_{T,avg} \cong \frac{Z_{1,T} + Z_{2,T} + Z_{3,T}}{3} \cong \frac{V_T}{I_0}\left(1 + \frac{\delta_1^2}{6} + \frac{\delta_2^2}{6} - \frac{\delta_1\delta_2}{3}\right) \quad (7a)$$

$$Z_{B,avg} \cong \frac{Z_{1,B} + Z_{2,B} + Z_{3,B}}{3} \cong \frac{V_B}{I_0}\left(1 + \frac{\delta_1^2}{6} + \frac{\delta_2^2}{6} - \frac{\delta_1\delta_2}{3}\right) \quad (7b)$$

As shown in Equations (6a) and (6b), processing circuitry can determine the composite impedance for a battery cell by multiplying the preliminary impedance determinations and taking the root of the product. Additionally or alternatively, processing circuitry may be configured to use Equations (7a) and (7b), with or without modifications, to determine composite impedances for any measurement sequence, including the measurements sequences shown in Tables I-IV and other measurement sequences.

Figure 8:
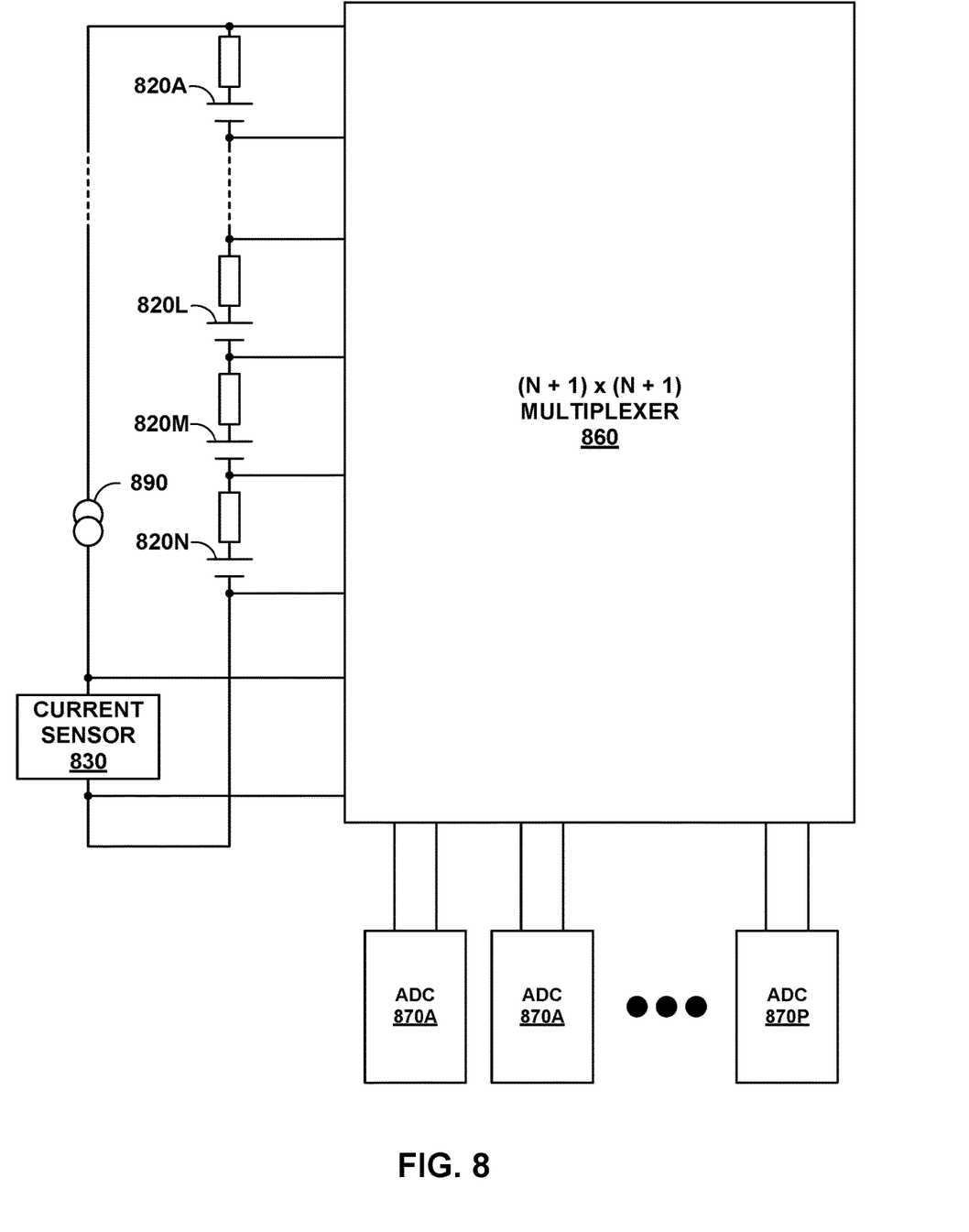

FIG. 8 shows a generic (N+1)×(N+1) multiplexer 860 for measuring the impedance of cells 820A-820N using, for example, the gain mismatch compensation techniques described herein. In the example of FIG. 8, N and P are integers, and P is equal to N plus one. N may be any integer greater than zero.

Table II shows an example measurement sequence for multiplexer 860 to connect N cells to N+1 ADCs. In Table II, cell 820L is the (N−2)-th cell, cell 820M is the (N−1)-th cell, and ADC 870P is the (N+1)-th ADC.

TABLE II

Measurement sequence for multiplexer 860.

| | First instance | Second instance | Third instance | (N + 1)-th instance |
|---|---|---|---|---|
| ADC 870A | Cell 820A | Sensor 830 | Cell 820N ... | Cell 820B |
| ADC 870B | Cell 820B | Cell 820A | Sensor 830 | Cell 820C |
| ADC 870C | Cell 820C | Cell 820B | Cell 820A | Cell 820D |
| ... | | ... | | ... |
| ADC 870N | Cell 820N | Cell 820M | Cell 820L | Sensor 830 |
| ADC 870P | Sensor 830 | Cell 820N | Cell 820M | Cell 820A |

Processing circuitry may be configured to apply the approximated formula in Equation (8) to determine the compensated impedance of the k-th cell. The measurement sequence and the approximated formula in Equation (8) are based on the assumption that the system is time-invariant, i.e., the individual mismatches do not drift during the measurement time. Drift by the individual mismatches can introduce error into the calculations.

$$\prod_{n=1}^{N+1} Z_{n,k} = \frac{V_k^{N+1}}{I_0^{N+1}}e^{j[(N+1)(\varphi_k - \alpha)]} \quad (8)$$

FIG. 8 depicts using N+1 number of ADCs 870A-870P to measuring the voltage and current of cells 820A-820N and current sensor 830. However, it is also possible to use a smaller number of ADCs, such as fewer than N+1, by increasing the number of measurements performed. In other words, the same ADC can be used more often. This approach reduces the number of ADCs but increases the required measurement time.

Figure 9:
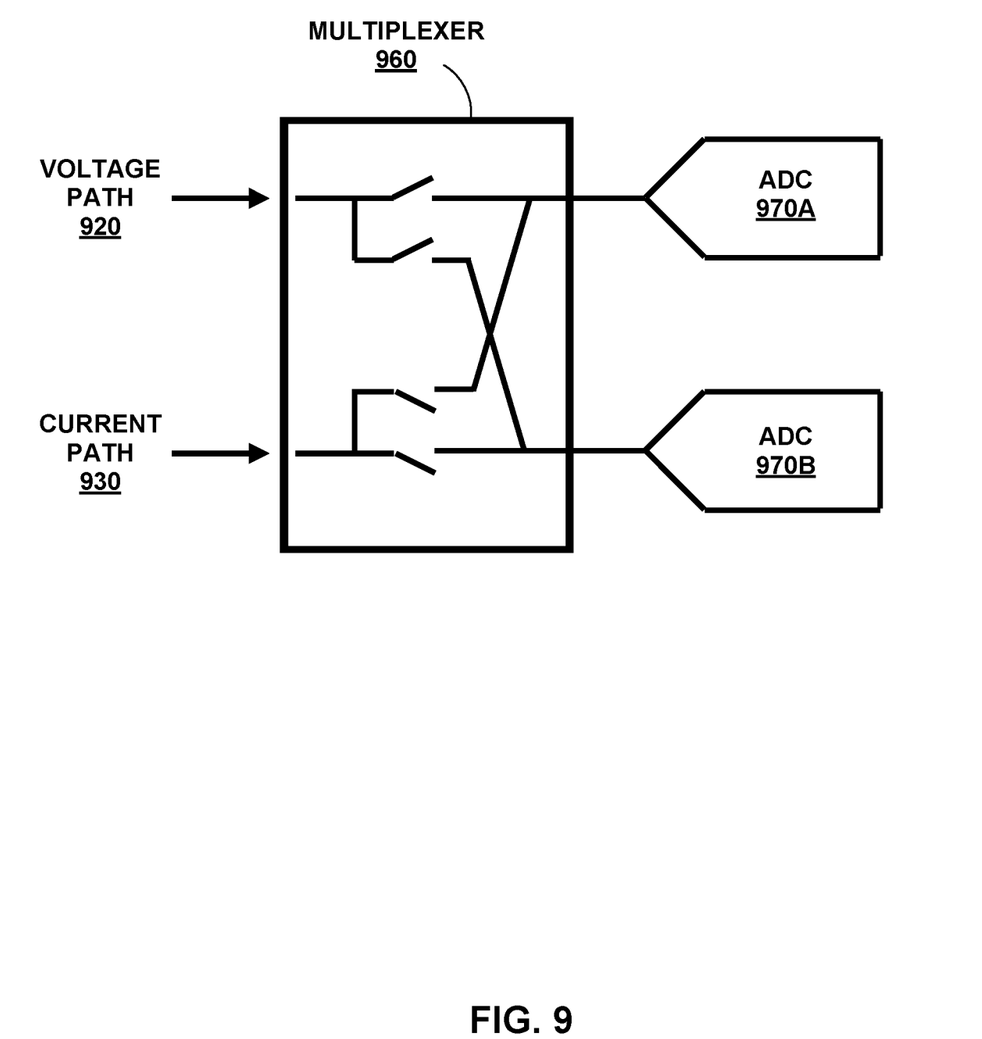
FIG. 9 is a circuit diagram of a multiplexer configured to connect two ADCs to a voltage path and a current path, in accordance with the techniques of this disclosure.

FIG. 9 is a circuit diagram of a multiplexer 960 configured to connect two ADCs 970A and 970B to a voltage path 920 and a current path 930, in accordance with the techniques of this disclosure. Although FIG. 9 depicts only one voltage path 920, there may be two ADCs 970A and 970B configured to measure the voltage across each of two cells. Multiplexer 960 may be configured to configured to connect ADCs 970A and 970B to the cells in one of the sequences shown in Tables III and IV.

Tables III and IV show two exemplary measurement sequences for measuring two cells with two ADCs 970A and 970B. Thus, Tables III and IV show example where N equals two. However, N may be larger than two, in some examples, such that an IC may include three ADCs configured to measure the voltage across three cells.

TABLE III

First measurement sequence for N ADCs

| | First instance | Second instance | Third instance | Fourth instance |
|---|---|---|---|---|
| ADC 970A | First cell | Current sensor | Second cell | Current sensor |
| ADC 970B | Current sensor | First cell | Current sensor | Second cell |

Table III shows an exemplary measurement sequence in which multiplexer 960, in a first instance, connects ADC 970A to a first cell through voltage path 920 and connects ADC 970B to a current sensor through current path 930. In a second instance of Table III, multiplexer 960 connects ADC 970A to the current sensor through current path 930 and connects ADC 970B to the first cell through voltage path 920. In a third instance, multiplexer 960 connects ADC 970A to a second cell through voltage path 920 and connects ADC 970B to the current sensor through current path 930. In a fourth instance, multiplexer 960 connects ADC 970A to the current sensor through current path 930 and connects ADC 970B to the second cell through voltage path 920.

TABLE IV

Second measurement sequence for N ADCs

|  | First instance | Second instance | Third instance |
|---|---|---|---|
| ADC 970A | First cell | Second cell | Current sensor |
| ADC 970B | Current sensor | First cell | Second cell |

Table IV shows an exemplary round-robin measurement sequence in which two battery cells can be simultaneously connected across each of paths 920 and 930. In a first instance of Table IV, multiplexer 960 connects ADC 970A to a first cell and connects ADC 970B to a current sensor. In a second instance of Table IV, multiplexer 960 connects ADC 970A to a second cell and connects ADC 970B to the first cell. In a third instance, multiplexer 960 connects ADC 970A to the current sensor and connects ADC 970B to the second cell.

Of the three measurement sequences shown in Tables I, III, and IV for sets of two cells, the measurement sequences shown in Tables I and IV use the shortest measurement time (e.g., fewest instances). Thus, these measurement sequences may be less prone to drift-related issues than the measurement sequence shown in Table III.

Figure 10:
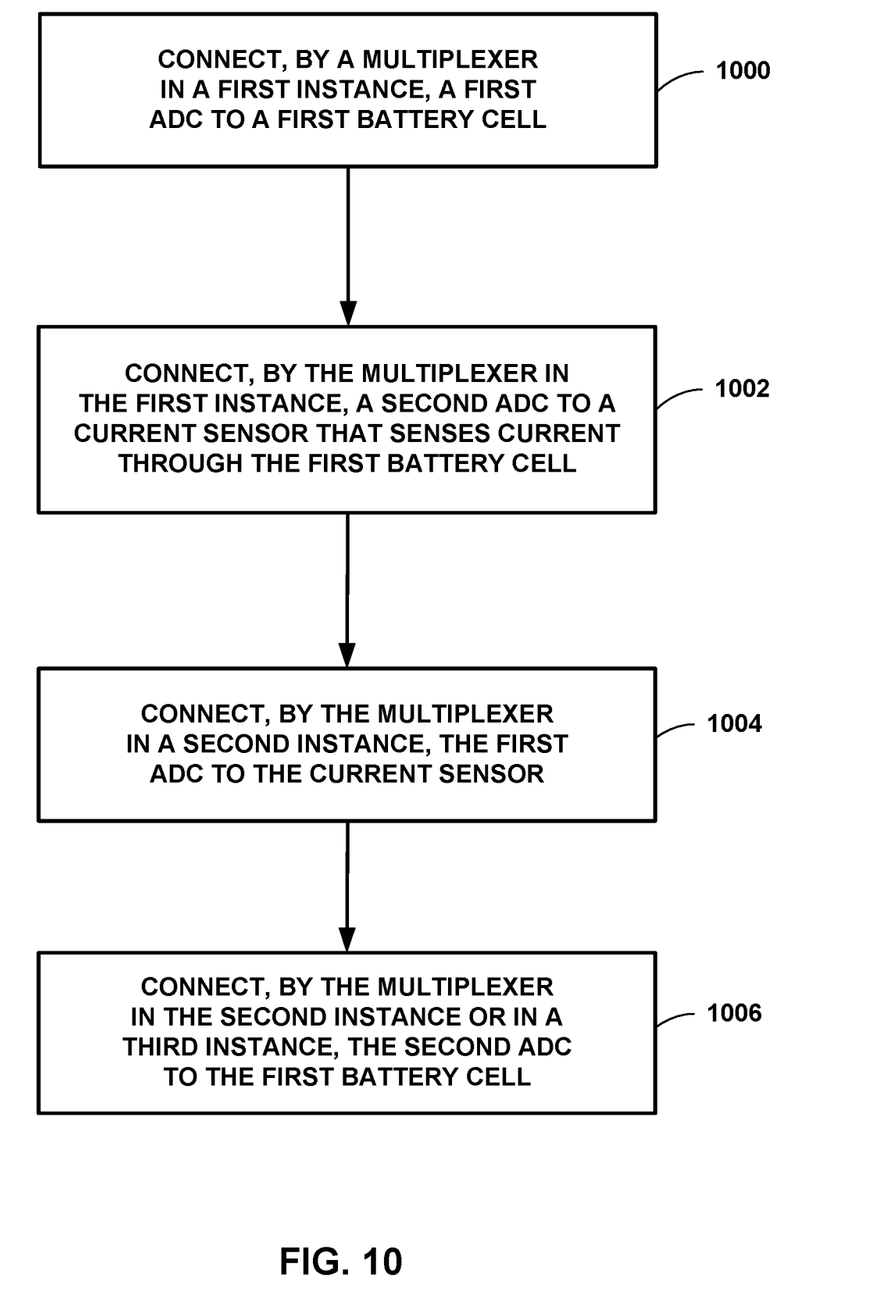
FIG. 10 is a flow diagram illustrating example techniques for measuring the impedance of a battery cell, in accordance with the techniques of this disclosure.

FIG. 10 is a flow diagram illustrating example techniques for measuring the impedance of a battery cell, in accordance with the techniques of this disclosure. The techniques of FIG. 10 are described with reference to the system shown in FIG. 1, although other components or devices may be used to perform similar techniques consistent with this disclosure.

In the example of FIG. 10, multiplexer 160 connects ADC 170A to cell 120A in a first instance (1000). Multiplexer 160 also connects ADC 170B to current sensor 130 in the first instance (1002). ADCs 170A and 170B may be configured to convert the voltage across cell 120A and the current through sensor 130 (e.g., the voltage across a current-sensing element) to digital numbers while multiplexer 160 has connected ADCs 170A and 170B to cell 120A and sensor 130.

Multiplexer 160 then connects ADC 170A to current sensor 130 in a second instance (1004). Multiplexer 160 connects ADC 170B to cell 120A in the second instance or in a third instance (1006). In the example measurement sequence shown in Table III, multiplexer 160 can connect ADC 170B to cell 120A in the second instance. In the example measurement sequences shown in Tables I and IV, multiplexer 160 can connect ADC 170B to cell 120A in the third instance.

This disclosure has attributed functionality to multiplexers 160, 460, 560, 660, 760, 860, and 960 and processing circuitry 180, 280, and 380. Processing circuitry 180, 280, and/or 380 may include one or more processors to implement such functions. For example, processing circuitry 180, 280, and/or 380 may include any combination of integrated circuitry, discrete logic circuitry, analog circuitry, such as one or more microprocessors, digital signal processors (DSPs), application specific integrated circuits (ASICs), and/or field-programmable gate arrays (FPGAs). In some examples, processing circuitry 180, 280, and/or 380 may include multiple components, such as any combination of one or more microprocessors, one or more DSPs, one or more ASICs, or one or more FPGAs, as well as other discrete or integrated logic circuitry, and/or analog circuitry.

The techniques described in this disclosure may also be embodied or encoded in an article of manufacture including a non-transitory computer-readable storage medium, such as a memory or storage unit associated with processing circuitry 180, 280, and/or 380. In some examples, the memory may be local and electrically integrated with the processing circuitry, or in other examples, the memory may be external and electrically connected to processing circuitry 160, such as via a data bus or direct connection. Example non-transitory computer-readable storage media may include RAM, ROM, programmable ROM (PROM), erasable programmable ROM (EPROM), electronically erasable programmable ROM (EEPROM), flash memory, a hard disk, magnetic media, optical media, or any other computer readable storage devices or tangible computer readable media. The term "non-transitory" may indicate that the storage medium is not embodied in a carrier wave or a propagated signal. In certain examples, a non-transitory storage medium may store data that can, over time, change (e.g., in RAM or cache).

The following numbered examples demonstrate one or more aspects of the disclosure.

Example 1

A method includes connecting, by a multiplexer in a first instance, a first ADC of at least two ADCs to a first battery cell. The method also includes connecting, by the multiplexer in the first instance, a second ADC of the at least two ADCs to a current sensor, wherein the current sensor is configured to sense current through the first battery cell. The method further includes connecting, by the multiplexer in a second instance, the first ADC to the current sensor. The method includes connecting, by the multiplexer in the second instance or in a third instance, the second ADC to the first battery cell.

Example 2

The method of example 1, further including connecting, in the first instance, a third ADC of the at least two ADCs to a second battery cell.

Example 3

The method of any preceding example, further including connecting, in the second instance, the second ADC to the second battery cell.

Example 4

The method of any preceding example, further including connecting, in the second instance, the third ADC to the first battery cell.

Example 5

The method of any preceding example, further including connecting, in the third instance, the first ADC to the second battery cell.

Example 6

The method of any preceding example, further including connecting, in the third instance, the second ADC to the first battery cell.

Example 7

The method of any preceding example, further including connecting, in the third instance, the third ADC to the current sensor.

Example 8

The method of any preceding example, further including connecting, in the second instance, the second ADC to the first battery cell.

Example 9

The method of any preceding example, further including connecting, in the third instance, the first ADC to a second battery cell.

Example 10

The method of any preceding example, further including connecting, in the third instance, the second ADC to the current sensor.

Example 11

The method of any preceding example, further including connecting, in a fourth instance, the first ADC to the current sensor.

Example 12

The method of any preceding example, further including connecting, in the fourth instance, the second ADC to the second battery cell.

Example 13

The method of any preceding example, further including connecting, in the second instance, the second ADC to a second battery cell.

Example 14

The method of any preceding example, further including connecting, in the third instance, the first ADC to the second battery cell.

Example 15

The method of any preceding example, further including connecting, in the third instance, the second ADC to the first battery cell.

Example 16

The method of any preceding example, further including connecting the at least two ADCs to the current sensor, the first battery cell, and a second battery cell in a round-robin sequence.

Example 17

The method of any preceding example, further including controlling, by processing circuitry, the multiplexer to perform the methods of 1-16 or any combination thereof.

Example 18

The method of any preceding example, further including determining an impedance of the first battery cell based on measurements taken by the at least two ADCs.

Example 19

The method of any preceding example, further including determining a first preliminary impedance based on a first output of the first ADC in the first instance and a second output of the second ADC in the first instance.

Example 20

The method of any preceding example, further including determining a second preliminary impedance based on the first output of the first ADC in the second instance and the second output of the second ADC in the second instance.

Example 21

The method of any preceding example, further including determining a composite impedance based on the first and second preliminary impedances.

Example 22

The method of any preceding example, where determining a first preliminary impedance includes determining a first Fourier representation by applying a first Fast Fourier Transform to the first output of the first ADC in the first instance

Example 23

The method of any preceding example, where determining a first preliminary impedance includes determining a second Fourier representation by applying a second Fast Fourier Transform to the second output of the second ADC in the first instance.

Example 24

The method of any preceding example, where determining a first preliminary impedance includes determining the first preliminary impedance by performing complex division on the first Fourier representation and the second Fourier representation.

Example 25

The method of any preceding example, further including measuring, impedances of N battery cells using N+1 ADCs.

Example 26

The method of any preceding example, further including providing, by a modulator driver, a drive signal at a drive signal frequency for driving a modulator connected across the first battery cell to cause a modulated drive current to flow through the first battery cell.

Example 27

A device includes a multiplexer configured to perform the method of any preceding example.

Example 28

The device of example 27, further including at least two ADCs including the first ADC and the second ADC configured to perform the method of examples 1-26 or any combination thereof.

Example 29

The device of example 27 or example 28, further including processing circuitry configured to perform the method of examples 1-26 or any combination thereof.

Example 30

The device of examples 27-29 or any combination thereof, further including a modulator driver configured to perform the method of example 26.

Example 31

A device can be used for measuring the impedance of a first battery cell. The device includes a first ADC and a second ADC. The device also includes a multiplexer configured to connect the first ADC to the first battery cell in a first instance and to connect the second ADC to a current sensor in the first instance. The current sensor is configured to sense current through the first battery cell. The multiplexer is also configured to connect the first ADC to the current sensor in a second instance and to connect the second ADC to the first battery cell in the second instance or in a third instance.

Example 32

A device includes a computer-readable medium having executable instructions stored thereon, configured to be executable by processing circuitry for causing the processing circuitry to perform the method of examples 1-26 or any combination thereof.

Example 33

A system includes means for performing the method of examples 1-26 or any combination thereof.

Various examples of the disclosure have been described. Any combination of the described systems, operations, or functions is contemplated. These and other examples are within the scope of the following claims.

What is claimed is:

1. A device for measuring an impedance of a first battery cell, the device comprising:
   at least three analog-to-digital converters (ADCs) including a first ADC, a second ADC, and a third ADC; and
   a multiplexer configured to:
      connect the first ADC to the first battery cell in a first instance;
      connect the second ADC to a current sensor in the first instance, wherein the current sensor is configured to sense current through the first battery cell;
      connect the third ADC to a second battery cell in the first instance;
      connect the first ADC to the current sensor in a second instance;
      connect the second ADC to the second battery cell in the second instance;
      connect the third ADC to the first battery cell in the second instance;
      connect the first ADC to the second battery cell in the third instance;
      connect the second ADC to the first battery cell in a third instance; and
      connect the third ADC to the current sensor in the third instance.

2. The device of claim 1, wherein the multiplexer is configured to connect the at least three ADCs to the current sensor, the first battery cell, and a second battery cell in a round-robin sequence.

3. The device of claim 1, further comprising processing circuitry configured to determine an impedance of the first battery cell based on measurements taken by the at least three ADCs.

4. The device of claim 3, wherein the processing circuitry is configured to determine the impedance by:
   determining a first preliminary impedance based on a first output of the first ADC in the first instance and a second output of the second ADC in the first instance;
   determining a second preliminary impedance based on the first output of the first ADC in the second instance and the second output of the second ADC in the second instance; and
   determining a composite impedance based on the first and second preliminary impedances.

5. The device of claim 4, wherein the processing circuitry is configured to determine the first preliminary impedance by:
   determining a first Fourier representation by applying a first Fast Fourier Transform to the first output of the first ADC in the first instance;
   determining a second Fourier representation by applying a second Fast Fourier Transform to the second output of the second ADC in the first instance; and
   determining the first preliminary impedance by performing complex division on the first Fourier representation and the second Fourier representation.

6. The device of claim 1,
   wherein the at least three ADCs are configured to measure impedances of N battery cells including the first battery cell and the second battery cell, and
   wherein the at least three ADCs comprise N+1 ADCs.

7. The device of claim 1, further comprising a modulator driver for providing a drive signal at a drive signal frequency for driving a modulator connected across the first battery cell to cause a modulated drive current to flow through the first battery cell.

8. A device for measuring an impedance of a first battery cell, the device comprising:
   at least two analog-to-digital converters (ADCs) including a first ADC and a second ADC; and
   a multiplexer configured to:
      connect the first ADC to the first battery cell in a first instance;

connect the second ADC to a current sensor in the first instance, wherein the current sensor is configured to sense current through the first battery cell;
connect the first ADC to the current sensor in a second instance;
connect the second ADC to the first battery cell in the second instance;
connect the first ADC to a second battery cell in the third instance;
connect the second ADC to the current sensor in the third instance;
connect the first ADC to the current sensor in a fourth instance; and
connect the second ADC to the second battery cell in the fourth instance.

9. A method comprising:
connecting, by a multiplexer in a first instance, a first analog-to-digital converter (ADC) of at least three ADCs to a first battery cell;
connecting, by the multiplexer in the first instance, a second ADC of the at least three ADCs to a current sensor, wherein the current sensor is configured to sense current through the first battery cell;
connecting, by the multiplexer in the first instance, a third ADC of the at least three ADCs to a second battery cell;
connecting, by the multiplexer in a second instance, the first ADC to the current sensor;
connecting, by the multiplexer in the second instance, the second ADC to the second battery cell;
connecting, by the multiplexer in the second instance, the third ADC to the first battery cell;
connecting, by the multiplexer in the third instance, the first ADC to the second battery cell;
connecting, by the multiplexer in a third instance, the second ADC to the first battery cell; and
connecting, by the multiplexer in the third instance, the third ADC to the current sensor.

10. The method of claim 9, further comprising:
connecting, in the second instance, the second ADC to a second battery cell;
connecting, in the third instance, the first ADC to the second battery cell; and
connecting, in the third instance, the second ADC to the first battery cell.

11. A system comprising:
a first battery cell;
a current sensor configured to sense the current through the first battery cell;
at least three analog-to-digital converters (ADCs) including a first ADC, a second ADC, and a third ADC; and
a multiplexer configured to:
connect the first ADC to the first battery cell in a first instance;
connect the second ADC to the current sensor in the first instance;
connect the third ADC to a second battery cell in the first instance;
connect the first ADC to the current sensor in a second instance;
connect the second ADC to the second battery cell in the second instance;
connect the third ADC to the first battery cell in the second instance;
connect the first ADC to the second battery cell in the third instance;
connect the second ADC to the first battery cell in a third instance; and
connect the third ADC to the current sensor in the third instance.

12. The system of claim 11, wherein the multiplexer is configured to connect the at least three ADCs to the current sensor, the first battery cell, and a second battery cell in a round-robin sequence.

13. The system of claim 11, further comprising:
the second battery cell, wherein the second battery cell is connected in series with the first battery cell; and
a modulator connected across the first and second battery cells to modulate a current driven by a voltage of the first and second battery cells in a current path through the modulator and back through the first and second battery cells.

* * * * *